US008258029B2

(12) United States Patent
Wu et al.

(10) Patent No.: US 8,258,029 B2
(45) Date of Patent: Sep. 4, 2012

(54) SEMICONDUCTOR STRUCTURE AND PROCESS FOR REDUCING THE SECOND BIT EFFECT OF A MEMORY DEVICE

(75) Inventors: Chao-I Wu, Hsinchu County (TW); Tzu-Hsuan Hsu, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 200 days.

(21) Appl. No.: 11/786,078

(22) Filed: Apr. 10, 2007

(65) Prior Publication Data

US 2008/0251831 A1 Oct. 16, 2008

(51) Int. Cl.
*H01L 31/113* (2006.01)
*H01L 21/336* (2006.01)
(52) U.S. Cl. ......... 438/257; 257/E21.209; 257/E21.662; 257/E21.663; 257/197; 257/201
(58) Field of Classification Search .................. 438/257; 257/E21.209, E21.662, E21.663, E21.679, 257/E21.68
See application file for complete search history.

(56) References Cited

U.S. PATENT DOCUMENTS

| | | | |
|---|---|---|---|
| 6,011,725 A | 1/2000 | Eitan | |
| 6,320,786 B1 | 11/2001 | Chang et al. | |
| 6,487,114 B2 | 11/2002 | Jong et al. | |
| 6,541,829 B2 * | 4/2003 | Nishinohara et al. | 257/402 |
| 2002/0000592 A1 | 1/2002 | Fujiwara | |
| 2002/0149060 A1 | 10/2002 | Ogura et al. | |
| 2007/0145448 A1 * | 6/2007 | Kobayashi et al. | 257/295 |

FOREIGN PATENT DOCUMENTS

TW      530388 A  *  5/2003

OTHER PUBLICATIONS

"Office Action of Taiwan Counterpart Application", issued on Jul. 4, 2011, p. 1-p. 4, in which the listed reference was cited.

* cited by examiner

*Primary Examiner* — Julio J Maldonado
*Assistant Examiner* — Mohammad Choudhry
(74) *Attorney, Agent, or Firm* — Jianq Chyun IP Office

(57) ABSTRACT

A non-volatile memory cell capable of storing two bits of information having a non-conducting charge trapping dielectric, such as silicon nitride, layered in association with at least one electrical dielectric layer, such as an oxide, with a P-type substrate and an N-type channel implanted in the well region of the substrate between two source/drain regions is disclosed. The N-type channel achieves an inversion layer without the application of bias voltage to the gate of the memory cell. A method that implants the N-type channel in the P-type substrate of the cell wherein the N-type channel lowers the un-programmed or programmed voltage threshold of the memory cell to a value lower than would exist without the N-type channel is disclosed. The N-type channel reduces the second bit effect such that the window of operation between the programmed and un-programmed voltage thresholds of the bits is widened.

9 Claims, 11 Drawing Sheets

CHE Program at Bit-L to high-Vt

2nd-bit effect:
As we are only using CHE to program Bit-L, the Vt of Bit-R will also be increased.

Use N-type channel implantation to achieve –Vt level

SEMICONDUCTOR STRUCTURE AND PROCESS FOR REDUCING THE SECOND BIT EFFECT OF A MEMORY DEVICE

BACKGROUND OF THE INVENTION

The present invention relates to a non-volatile flash memory ("NVM") semiconductor device which is able to continually store information even when the supply of electricity is removed from the device containing the NVM cell. More particularly, the invention relates to the structure of a NVM semiconductor device having two-bits per cell that are typically employed in memory arrays such as virtual ground (VG) arrays or not-and-gate (NAND) arrays (know as multi-level flash memory). Also, the invention relates to a method for the fabrication of a NVM semiconductor device having two-bits per cell. The invention impacts an NVM semiconductor device's "window of operation", broadening the window which permits more effective use of two-bits per cell NVM semiconductor devices.

Multi-level, or multi-bit, flash memory cells provide a solution for increasing the amount of data that can be stored on a memory device without consuming more space. Whereas a single-bit cell can store only two states, "on" and "off" (typically labeled "0" and "1"), a cell having n bits and using binary encoding is capable of storing up $2^n$ states. Thus, a two-bit cell may store data in four discrete states, "00", "01", "10" and "11" which is distinctly more efficient that the "0" or "1" state alone. FIG. 1A shows a typical two-bit cell, generally labeled 10. The cell 10 has symmetrical source/drain regions 14 and 16 in connection with a semiconductor well 30. The well 30 and a gate 26 are separated from a charge trapping layer 20 by oxide regions 18 and 22. In some embodiments oxide layer 22 is not included in the NVM structure, as in the case of the NVM cell 40 shown in FIG. 1B.

A limitation with two-bits per cell NVM semiconductor devices is a narrow "window of operation" that exists after the conventional programming of a two-bit cell. The window of operation is generally described as the difference in the threshold voltage (Vt) of a programmed cell bit as compared to the Vt of the un-programmed (erased) state. FIG. 1C illustrates the distribution of the un-programmed Vt of the right bit 36 of FIG. 1D as well as the distribution of the programmed Vt of the right bit 36 of FIG. 1D (not shown). As FIG. 1C indicates, the window of operation of 4V in this example is that difference between the highest Vt of the un-programmed state 1 and the lowest Vt of the programmed state 0. Voltage thresholds and techniques for programming the left and right bits of NVM semiconductors are discussed in U.S. Pat. No. 6,011,725 (Eitan), the contents of which is incorporated by reference herein. As a cell bit is programmed from an un-programmed state (a logic 1) to a programmed state (a logic 0) the threshold voltage increases for that bit.

The greater the difference in the un-programmed Vt from the programmed-Vt allows for a clearer distinction between the programmed and un-programmed cell states for one-bit cells or to describe the state of the right bit and/or the left bit for two-bit cells. A greater difference between Vt of the two bits in a two-bit cell also allows for a clearer discrimination among the four distinct programmed cell states referred to above. Greater differences between the programmed and un-programmed state Vt, in other words a larger operational window, can be accomplished by programming from a lower voltage threshold. The lower the Vt pre-programming, then greater discrimination will exist between the un-programmed state and the programmed state. Memory cells with a larger operation window have the advantage of tolerating more charge loss and read disturb and such cells have greater endurance, which refers to the cycling of the program and erase steps.

As indicated in FIG. 1C, the window of operation is also known as the second bit window of operation regarding a two-bit memory cell. The second bit window of operation is generally described as the effect on the Vt of one bit that is not undergoing a programming action by the programming of the other bit associated with the same cell (the target bit). In other words, as seen in FIGS. 1E and 1F, as the left bit of memory cell 10, like that of the NVM shown FIG. 1A, is programmed from its initial state with un-programmed Vt to its programmed state with a programmed Vt, the Vt of the right bit undergoes a "shift" in that, although it is not being programmed, the right bit Vt is adjusted higher anyway and, thus has a higher Vt for the same bit state that existed before the left bit was programmed. As FIG. 2 indicates, the lower the Vt of both the bit to be programmed (the target bit of the cell) and the non-programmed bit (non-target bit of the cell), then a lower Vt shift for the non-programmed bit will be induced as the programmed bit undergoes a larger Vt shift for programming purposes. As seen in FIG. 2, the N-type channel implantation of the present invention provides a programmed Vt that is lower than the programmed Vt of a cell like that of the memory cell 10 of FIG. 1A or memory cell 40 of FIG. 1B that has no N-type channel implantation.

The conventional memory structure of the memory cell 10 and 40 of FIGS. 1A and 1B includes a P-type substrate 12 with no N-type channel implanted in the well region 30. This requires a positive Vg bias be applied to the gate 26 in order to achieve the inversion layer and induce a channel in the well 30.

Programming (i.e. charge injection) in two-bit NVM cells is achieved by various conventional hot carrier injection methods such as channel hot electron injection (CHE), source side injection (SSI) or channel initiated secondary electron (CHISEL). Erasing (i.e. charge removal) in two-bit NVM cells is achieved by various conventional methods such as band-to-band hot hole tunneling (BTBHH).

It is desirable to begin programming of two-bit memory cells with a lower Vt so that there will be a larger widow between the Vt of the programmed state and Vt of the non-programmed state in that there is a smaller Vt shift imposed on the non-programmed bit as the other, target bit, is programmed. For the same reasons, it is also desirable to have a lower programmed Vt state for a bit in a two-bit cell as compared to the un-programmed or erased Vt of the same bit.

BRIEF SUMMARY OF THE INVENTION

The present invention relates to non-volatile memory ("NVM") semiconductor devices that implement multiple bit programming, specifically two-bits per cell. Further, this invention relates to a structure and a method for reducing the second bit effect on the two-bit NVM cell and thereby increase the window of operation of the two-bit cell.

The structure of one of the embodiments of the present invention, N-type channel implantation in the well region between the two source/drain regions of a two-bit NVM semiconductor increases the second bit window of operation of the two-bit cell NVM by lowering the voltage threshold or the erased Vt of both the left and right bits so that the effect of programming one of the left or right bits (the target bit) on the Vt of the non-target bit is lower than if the Vt of both bits was at a higher level. The N-type channel also has the effect of lowering the programmed Vt of both the left and right bits of the NVM cell as compared to the un-programmed Vt of the respective cells. Embodiments of this invention provide for N-type channel implantation in NVM cells with one or two oxide dielectric layers in the charge trapping layered structure of the NVM cell.

In each of the structural embodiments of the invention the N-type channel implantation in the well region of the P-type substrate between the two source/drain regions achieves an inversion layer without the application of any bias voltage on the gate of the NVM cell.

Another embodiment of the present invention includes memory arrays which have a plurality of memory cells according to one or more of the embodiments of the present invention.

Another embodiment of the present invention includes methods which include providing a semiconductor P-type substrate, N-type implantation of a layer onto the P-type substrate, deposition of an oxide-nitride (ON) or an oxide-nitride-oxide (ONO) charge trapping layered structure above the P-type substrate, N-type implantation of two source/drain regions in the P-type substrate, Polysilicon deposition above the ON or ONO charge trapping layered structure, P-type implantation of the P-type substrate channel region between the Polysilicon regions, and oxide deposition above the ON or ONO charge trapping layered structure between the Polysilicon depositions.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1A:
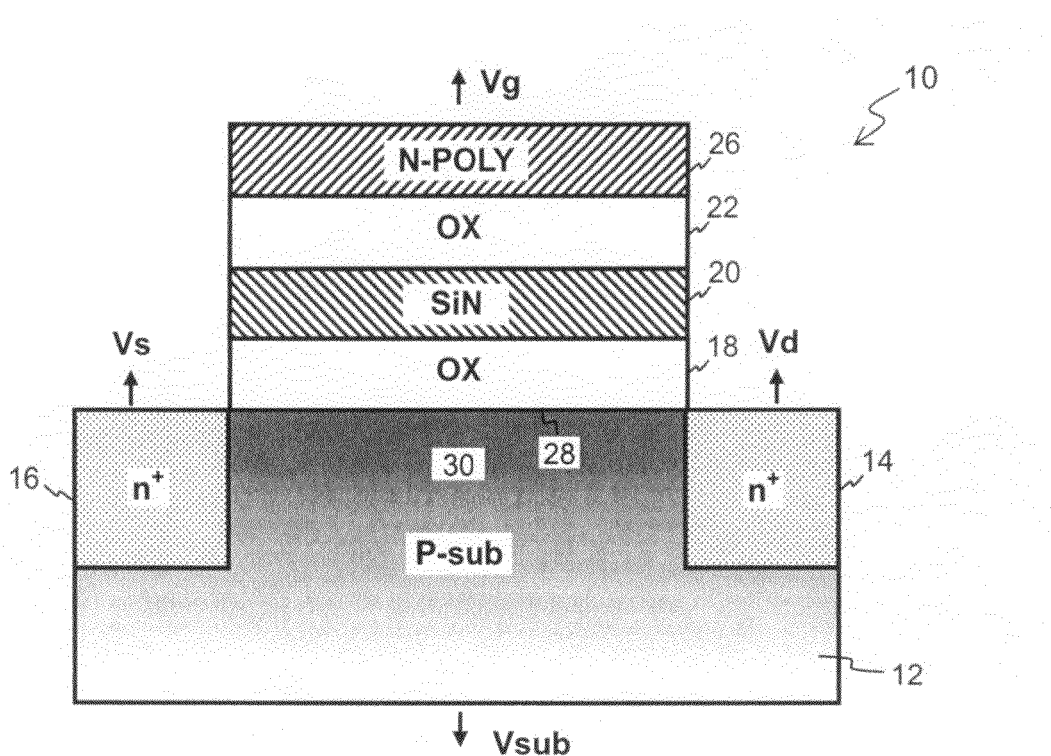
FIG. 1A is a partial sectional side elevation view of a conventional non-volatile memory (NVM) with an oxide-nitride-oxide (ONO) charge trapping layered structure.

The word "a" and the word "an", as used in the claims and in the corresponding portions of the specification, means "at least one." Also as used herein, reference to conductivity will be limited to the embodiment described. However, those skilled in the art know that p-type conductivity can be switched with n-type conductivity and the device would still be functionally correct (i.e., a first or second conductivity type). Therefore, where used herein, the reference to n or p can also mean either n or p and or p and n can be substituted therefore.

Referring to the drawings in detail, wherein like reference numerals indicate like elements throughout, there is shown in FIGS. 1A-1H and 3A-4B non volatile memory (NVM) cells 10, 40, 60, and 80, where indicated, in accordance with a preferred embodiment of the present invention.

FIG. 1A is a partial sectional side elevational view of a conventional non-volatile memory (NVM) cell 10 having a well/substrate 12, a well region 30, a first source/drain layer 14, a second source/drain layer 16, an oxide layer 18, a second oxide layer 22, a nitride charge trapping layer 20, and a gate layer 26. The NVM cell 10 also has a substrate main surface 28.

Figure 1B:
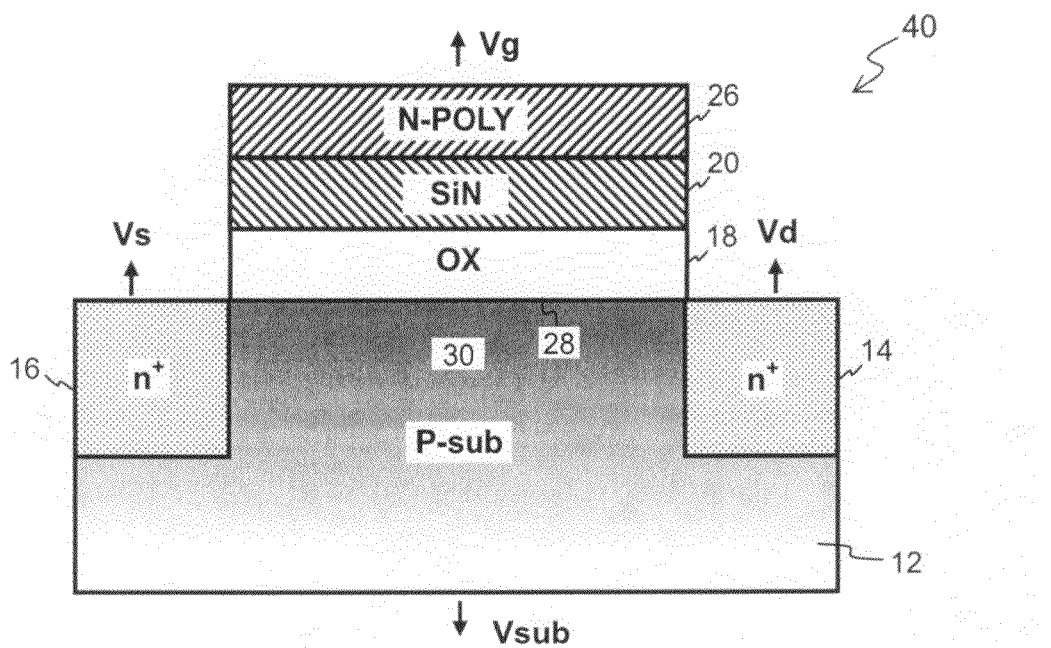
FIG. 1B is a partial sectional side elevation view of a conventional non-volatile memory (NVM) with an oxide-nitride (ON) charge trapping layered structure.
Figure 1C:
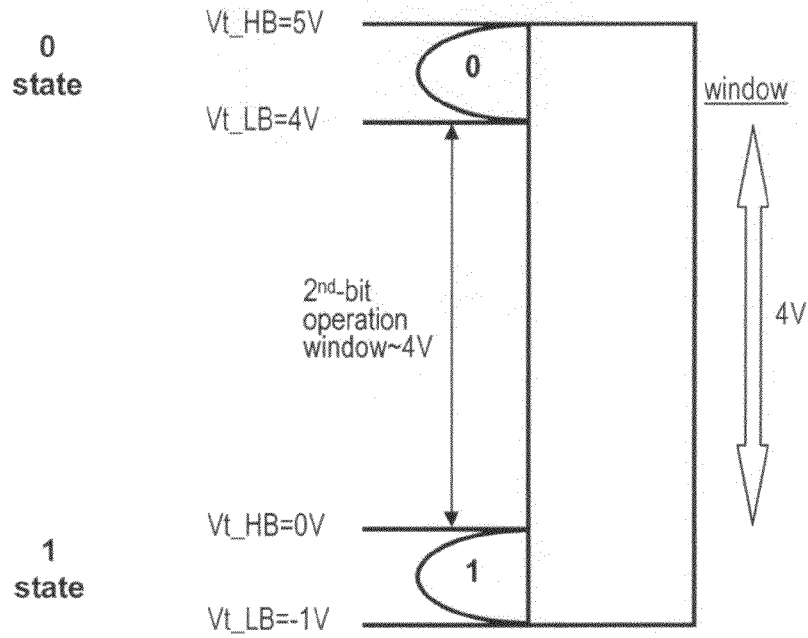
FIG. 1C is an illustration of the second bit window of operation as one bit in a two-bit NVM cell of FIG. 1A transitions from an un-programmed state to a programmed state.
Figure 1D:
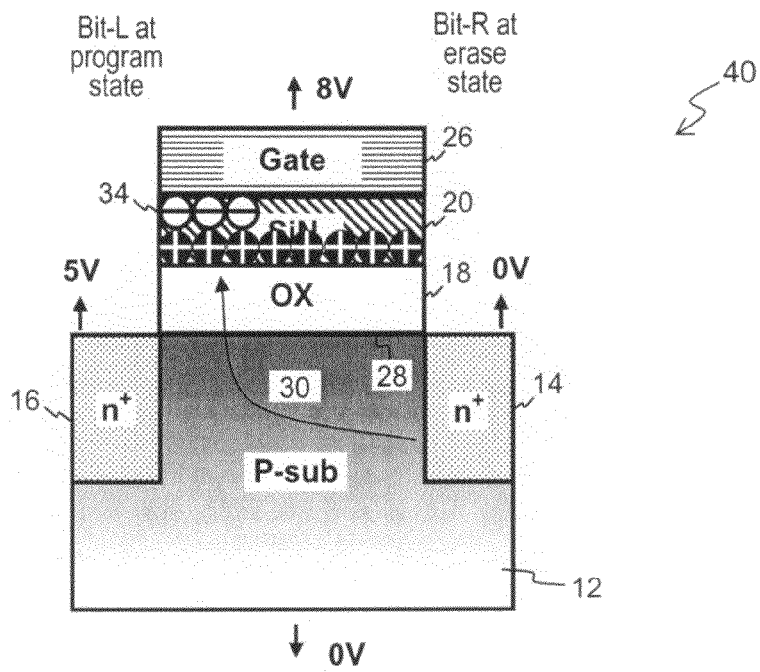
FIG. 1D is a partial sectional side elevation view of a two-bit NVM cell with an oxide-nitride charge trapping layered structure in which the left bit is programmed and the right bit is un-programmed.
Figure 1E:
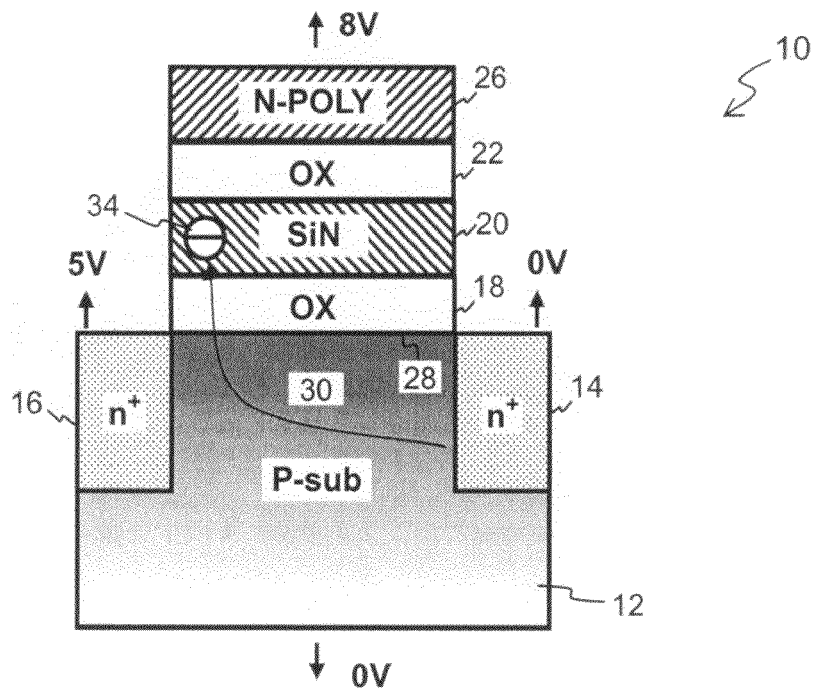
FIG. 1E is a partial sectional side elevation view of the NVM of FIG. 1A demonstrating conventional channel hot electron injection (CHE) programming of the cell's left bit (Bit-L)

FIG. 1B is a partial sectional side elevational view of a conventional non-volatile memory (NVM) cell 40 having a well/substrate 12, a well region 30, a first source/drain layer 14, a second source/drain layer 16, an oxide layer 18, a second oxide layer 22, a nitride charge trapping layer 20, and a gate layer 26. The NVM cell 10 also has a substrate main surface 28.

Figure 1F:
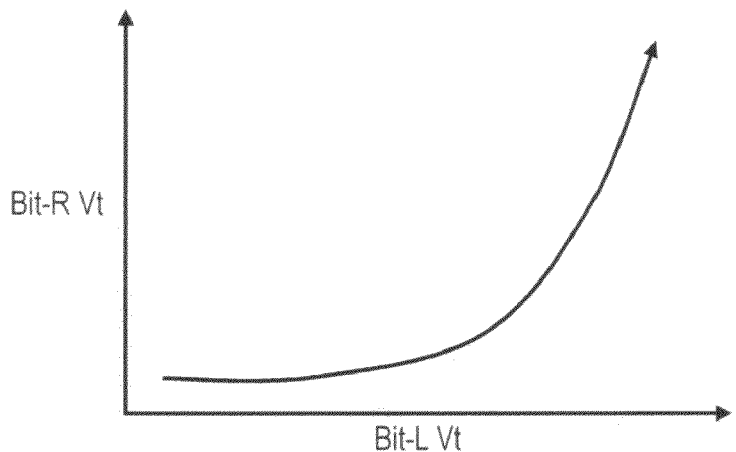
FIG. 1F is a graphical illustration of the second bit effect as demonstrated by the change of the voltage threshold (Vt) of Bit-R while Bit-L is programmed with a conventional programming method.
Figure 1G:
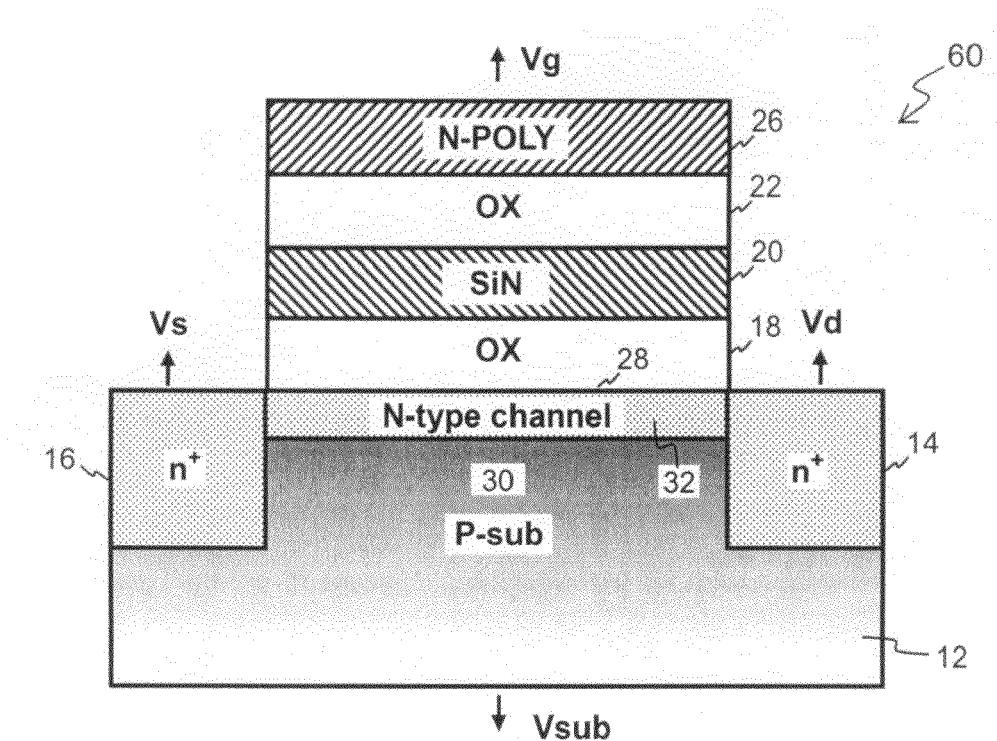
FIG. 1G is a partial sectional side elevation view of a non-volatile memory (NVM) with an oxide-nitride-oxide (ONO) charge trapping layered structure and a N-type channel implantation in accordance with a preferred embodiment of the present invention.

FIG. 1G is a partial sectional side elevational view of a conventional non-volatile memory (NVM) cell 60 having a well/substrate 12, a well region 30, a first source/drain layer 14, a second source/drain layer 16, an oxide layer 18, a second oxide layer 22, a nitride charge trapping layer 20, and a gate layer 26. The NVM cell 10 also has a substrate main surface 28. Memory cell 60 also has a N-type channel implantation 32 in the well region 30 between the first source/drain layer 14 and the second source/drain layer 16 in a preferred embodiment of the present invention.

Figure 1H:
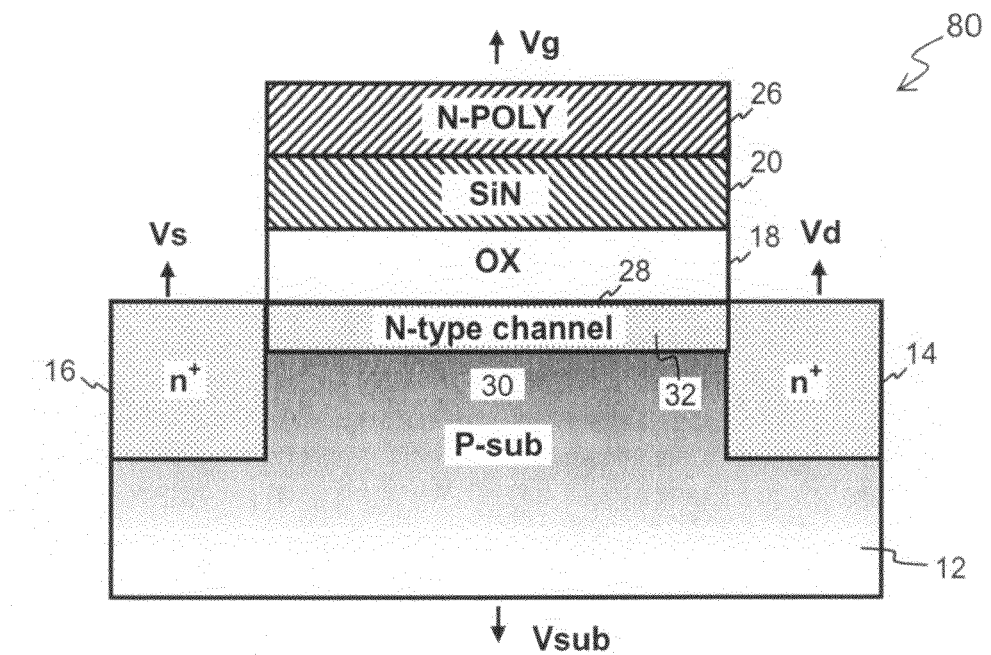
FIG. 1H is a partial sectional side elevation view of a non-volatile memory (NVM) with an oxide-nitride (ON) charge trapping layered structure and a N-type channel implantation in accordance with a preferred embodiment of the present invention.

FIG. 1H is a partial sectional side elevational view of a conventional non-volatile memory (NVM) cell 80 having a well/substrate 12, a well region 30, a first source/drain layer 14, a second source/drain layer 16, an oxide layer 18, a second oxide layer 22, a nitride charge trapping layer 20, and a gate layer 26. The NVM cell 10 also has a substrate main surface 28. Memory cell 60 also has a N-type channel implantation 32 in the well region 30 between the first source/drain layer 14 and the second source/drain layer 16 in another preferred embodiment of the present invention.

Referring to FIGS. 1G and 1H, the gate layer 26 may be composed of the n-polysilicon doped material as shown or the gate layer may be made from p-doped polysilicon material or it could be a metal. A NVM cell such as 60 and 80 will at any given time have a threshold voltage Vt such that the Vt is that voltage, applied to the gate of the cell, at which the NVM cell conducts current from a first source/drain region to the second source/drain region. Programming the right or left bit of an NVM cell from a 1,1 (Bit-L and Bit-R both un-programmed) state to a 0,1 (Bit-L programmed and Bit-R un-programmed) or 1,0 (Bit-L un-programmed and Bit-R programmed) or 0,0 (Bit-L and Bit-R both programmed) state causes the Vt of the NVM to increase.

Figure 4A:
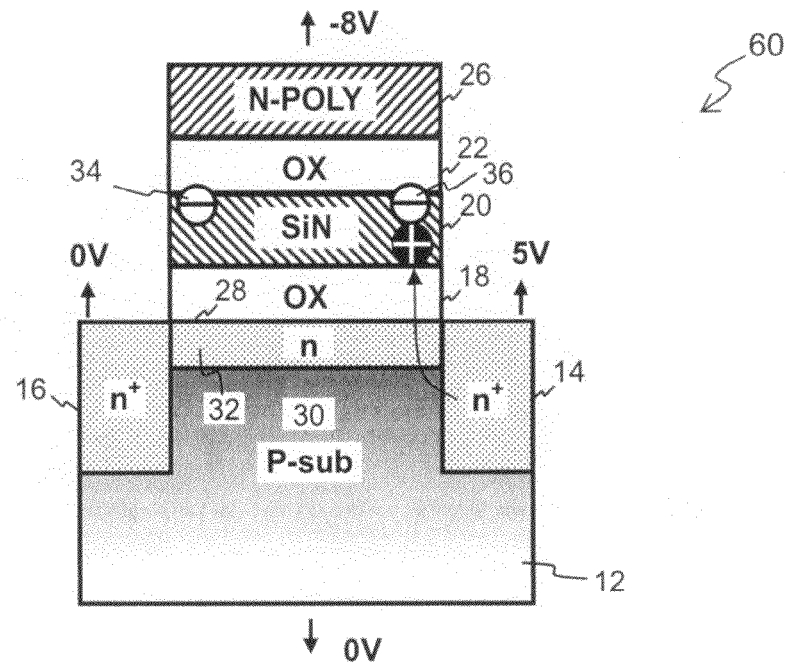
FIG. 4A is a partial sectional side elevation view of a non-volatile memory (NVM) cell of FIG. 1G undergoing conventional band-to-band hot hole (BTBHH) erasure of the right bit (Bit-R) of the cell.

FIG. 4A is a partial sectional side elevation view of the NVM cell 60 of FIG. 1G demonstrating conventional band-to-band hot hole erasure of right bit 36 in accordance with the preferred embodiments of the present invention. As seen in FIG. 4A, holes can be induced to flow from source/drain layer 14 into the nitride layer 20 by application of a gate voltage bias of −8 volts direct current on the gate layer 26, application of 5 volts direct current to the source/drain layer 14, and the application of a reference voltage to the source/drain layer 16 and to the well/substrate region. The presence of the n-type channel creates a depletion mode, even with a gate bias voltage less than 0 volts direct current. With this depletion mode, the BTBHH erasure on a NVM cell 60, results in a lower cell Vt, likely into a negative region. This reduced Vt, precedent to a bit being programmed, provides for a lower Vt shift from un-programmed state to a programmed state that is desired to lower the second bit effect on the Vt of the un-programmed bit. The same BTBHH erasure can be made to right bit 36 of memory cell 80 with the same results.

Figure 4B:
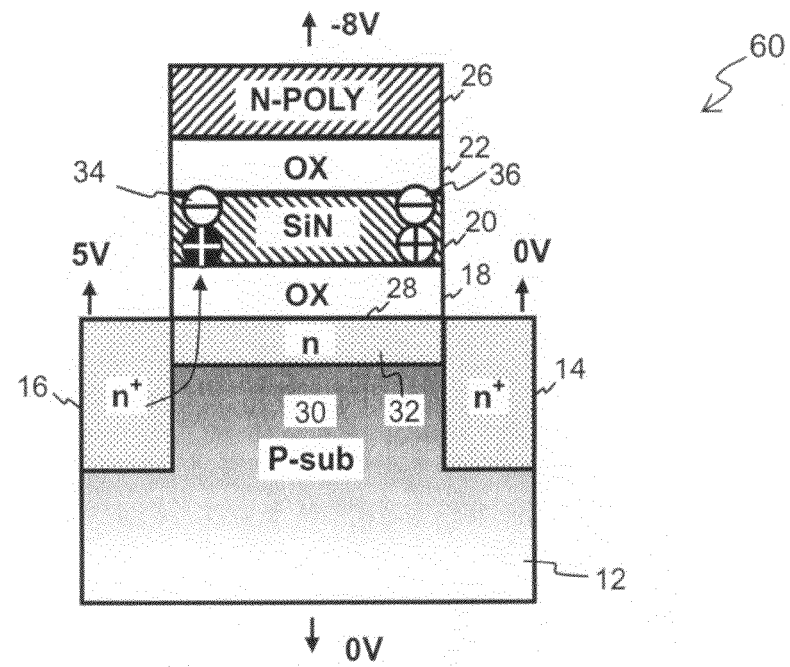
FIG. 4B is a partial sectional side elevation view of a non-volatile memory (NVM) cell of FIG. 4A, with an already erased right bit (Bit-R), undergoing conventional band-to-band hot hole (BTBHH) erasure of the left bit (Bit-R) of the cell.

FIG. 4B is a partial sectional side elevation view of the NVM cell 60 of FIG. 1G demonstrating conventional band-to-band hot hole erasure of left bit 34 in accordance with the preferred embodiments of the present invention. As seen in FIG. 4B, holes can be induced to flow from source/drain layer 16 into the nitride layer 20 by application of a gate voltage bias of −8 volts direct current on the gate layer 26, application of 5 volts direct current to the source/drain layer 16, and the application of a reference voltage to the source/drain layer 14 and to the well/substrate region. The presence of the N-type channel creates a depletion mode, even with a gate bias voltage less than 0 volts direct current. With this depletion mode, the BTBHH erasure on a NVM cell 60, results in a lower cell Vt, likely into a negative region. This reduced Vt, precedent to a bit being programmed, provides for a lower Vt shift from un-programmed state to a programmed state that is desired to lower the second bit effect on the Vt of the un-programmed bit. The same BTBHH erasure can be made to left bit 34 of memory cell 80 with the same results.

Figure 3A:
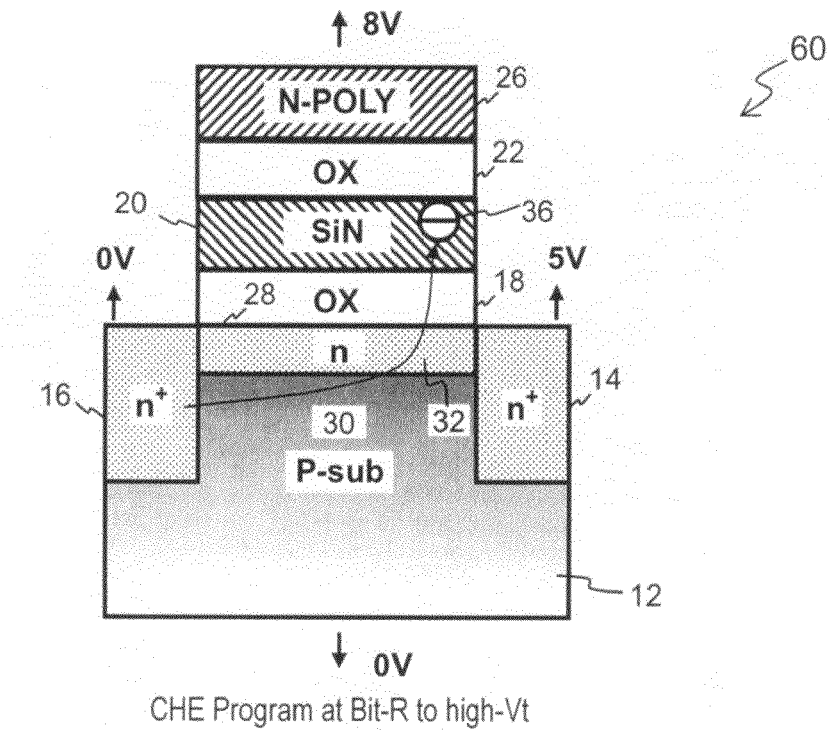
FIG. 3A is a partial sectional side elevation view of a non-volatile memory (NVM) cell of FIG. 1G undergoing conventional channel hot electron (CHE) programming of the right bit (Bit-R) of the cell.

FIG. 3A is a partial sectional side elevation view of non-volatile memory (NVM) cell 60 of FIG. 1G undergoing conventional channel hot electron (CHE) programming of the right bit 36 (Bit-R) in accordance with a preferred embodiment of the present invention. By programming the cell's Bit-R 36, the Vt of the cell's Bit-R 36 increases the Vt to a higher, programmed level. In FIG. 3A, electrons can be induced from the source/drain layer 16 by applying 8 volts direct current applied to the gate 26, applying 5 volts direct current to source/drain layer 14, and applying a reference voltage to source/drain layer 16 and the substrate 12. The same CHE programming can be made to right bit 36 of memory cell 80 with the same results.

Figure 3B:
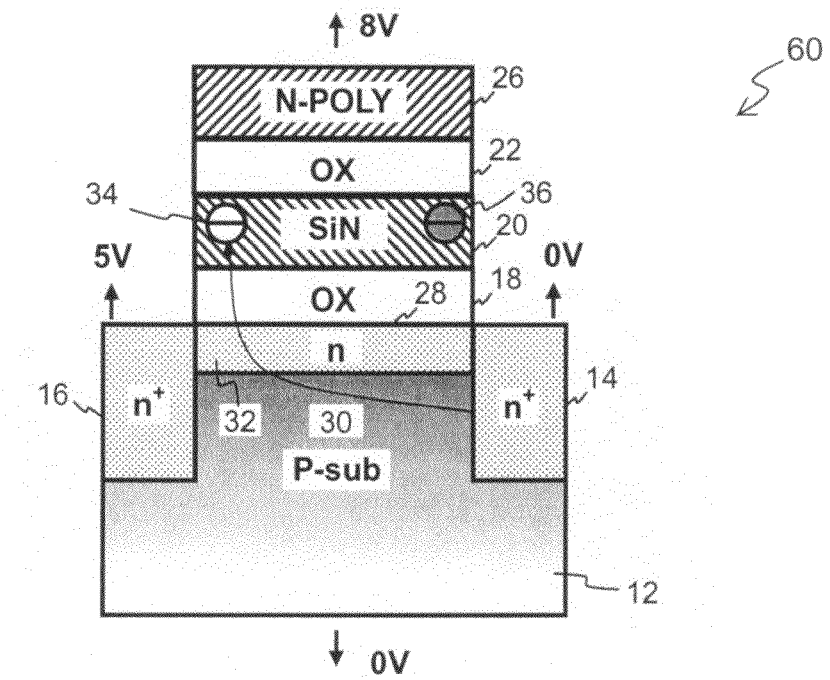
FIG. 3B is a partial sectional side elevation view of the non-volatile memory (NVM) cell of FIG. 3A, with an already programmed right bit (Bit-R), undergoing conventional channel hot electron (CHE) programming of the left bit (Bit-L)

FIG. 3B is a partial sectional side elevation view of non-volatile memory (NVM) cell 60 of FIG. 1G undergoing conventional channel hot electron (CHE) programming of the left bit 34 (Bit-L) in accordance with a preferred embodiment of the present invention. By programming the cell's Bit-L 34, the Vt of the cell's Bit-L 34 increases from the un-programmed Vt to a higher, programmed level. In FIG. 3B, electrons can be induced from the source/drain layer 14 by applying 8 volts direct current applied to the gate 26, applying 5 volts direct current to source/drain layer 16, and applying a reference voltage to source/drain layer 14 and the substrate 12. The same CHE programming can be made to left bit 34 of memory cell 80 with the same results.

Figure 2:
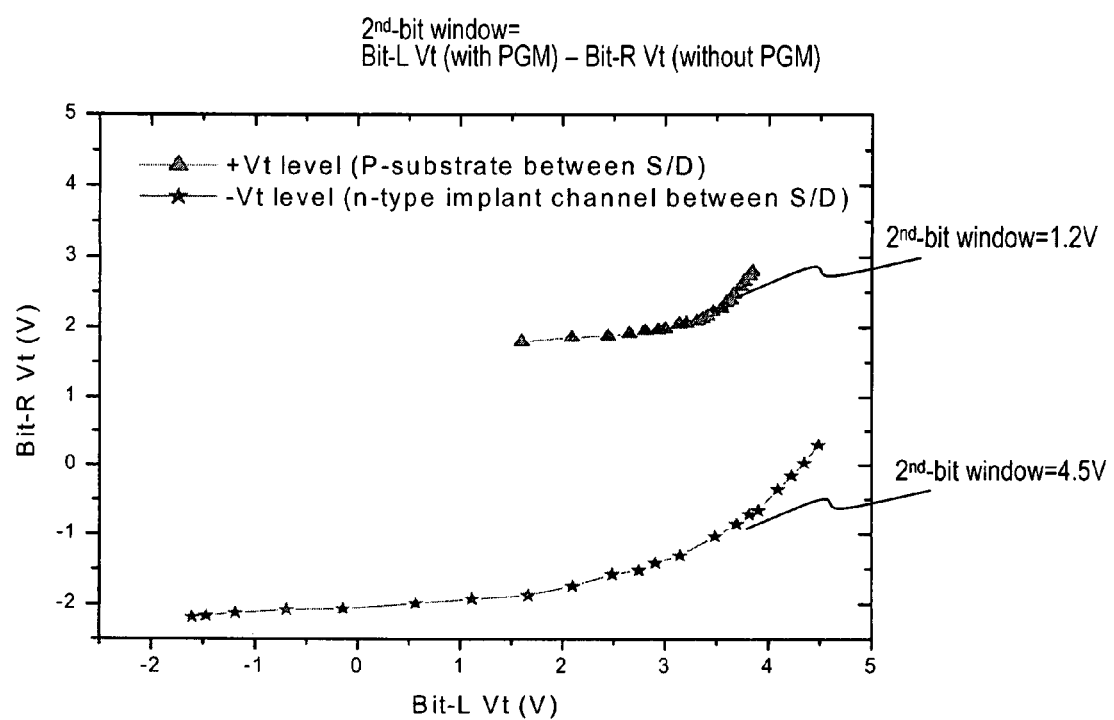
FIG. 2 is a graphical illustration of the window of operation of both a programmed NVM cell with the N-type channel implantation in accordance with a preferred embodiment of the present invention and of a NVM cell without the N-type channel implantation.

The effect of N-type implantation on the Vt of the NVM cells 60 and 80 can be seen graphically on FIG. 2. As FIG. 2 shows, the erased or un-programmed Vt of the memory cell 60 and 80 will be lower than the Vt of cells 10 and 40 that do not have the N-type channel implantation. As seen in FIG. 2, with a lower Vt due to the N-type channel implantation, the second bit effect of the programming of the Bit-L 34 on the Vt of Bit-R 36 (the non-target bit) of memory cells 60 and 80 will be nominal as compared to that of memory cells 10 and 40. In the example of FIG. 2, the difference in the Vt shifts of both bits of memory cells 60 and 80 results in a 4.5 volt second bit window of operation. This is in contrast to the 1.2 volt second bit window of operation the results from the identical operation conducted on memory cells 10 and 40, cells that lack the N-type channel.

Without the N-type implantation of the current invention, the Vt of the NVM cells 60 and 80 would be higher at the completion of the conventional programming and erasure steps. Given the non-linear relationship between the Vt of the programmed bit and the non-programmed bit's Vt as seen in FIG. 1F, a higher required Vt for the programmed bit will result in a greater shift for of the Vt of the non-programmed bit Vt. A greater shift in the Vt for the non-programmed bit will narrow the widow between the Vt of the programmed bit Vt and the non-programmed bit Vt.

A method of forming a non-volatile memory cell in accordance with a preferred embodiment of the present invention for use in an individual capacity or in a memory array is disclosed in FIGS. 5A-8. Although FIGS. 5A to 8 show the formation of a memory cell like that of cell 60 of FIG. 1G (containing the ONO charge trapping layered structure) the method could be applied to form a memory cell like that of cell 80 of FIG. 1H as indicated below.

Figure 5A:
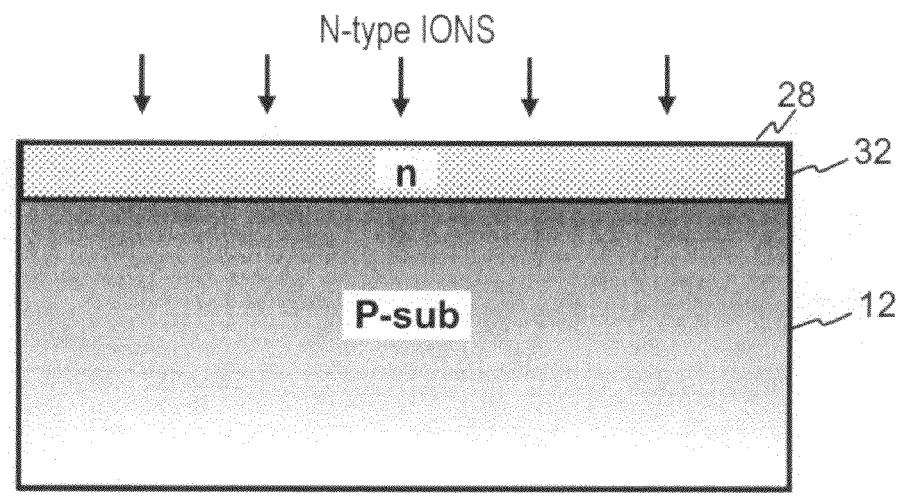
FIG. 5A is a schematic of a N-type channel formation process in a NVM cell accordance with a preferred embodiment of the present invention.

In FIG. 5A, a photo-resist material (an ion implantation resistant layer) is applied to a P-type substrate 12 to open the non-memory array region. An N-type channel 32 is then formed on the channel region of the substrate 12 by N-type ion implantation. The photo-resist material is then removed after the N-type implantation. A substrate main surface 28 is formed at the top of the N-type channel 32. The target depth for the N-type channel implantation is 1000 Angstroms (Å).

Figure 5B:
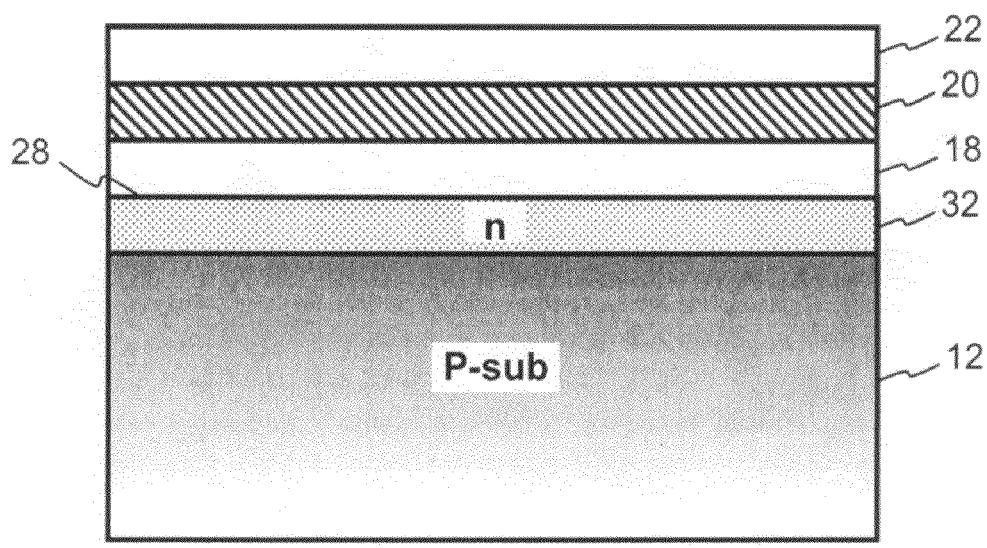
FIG. 5B is a schematic of a deposition process of a charge trapping layered structure of a NVM cell in accordance with a preferred embodiment of the present invention.

In FIG. 5B, the charge trapping layered structure is deposited on the main surface 28 of the P-type substrate 12. The layer is comprised of a dielectric layer 18 proximate the main surface 28, the charge trapping layer 20 disposed above dielectric layer 18, and a second dielectric layer 22 disposed above the charge trapping layer 20. In a preferred embodiment the dielectric layers 18 and 22 are comprised of an oxide and the trapping layer 20 is comprised of a silicon nitride. The target depth of layer 18 is 50 Å, the target depth of layer 20 is 70 Å, and the target depth of layer 22 is 90 Å. In another preferred embodiment, dielectric layer 22 is not included in the charge trapping layered structure.

Figure 6:
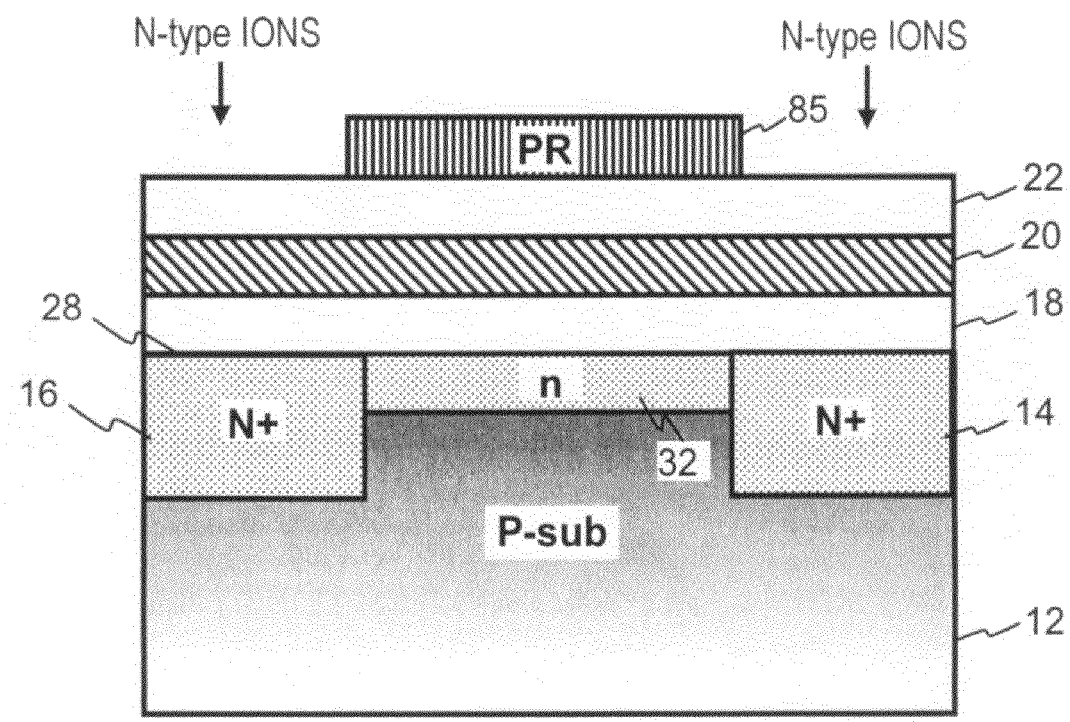
FIG. 6 is a schematic of a source/drain formation process in a NVM cell in accordance with a preferred embodiment of the present invention.

In FIG. 6, a photo-resist material 85 is applied to the top surface of the second dielectric layer 22 in an area that covers the surface of the emerging NVM cell except for source/drain regions 14 and 16 to be formed in the substrate 12 below the main surface 28. N-type ion implantation then forms the source/drain regions 14 and 16 in the substrate 12.

Figure 7:
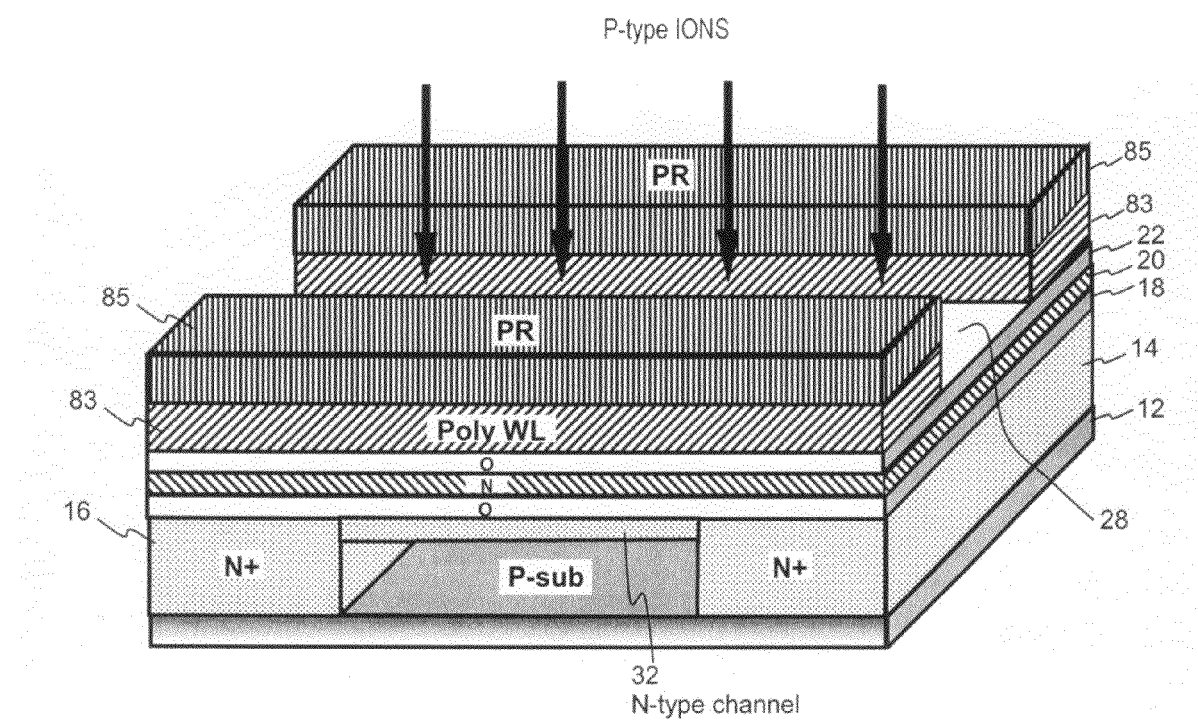
FIG. 7 is a schematic of a wordline formation and P-type channel formation process in a NVM cell in accordance with a preferred embodiment of the present invention.

In FIG. 7, the photo-resist material applied during the step described in FIG. 6 is removed. Polysilicon material 83 that may serve as wordlines in a memory array is deposited on the top surface of the second dielectric material layer 22. Photo-resist material 85 is applied to regions of the polysilicon material 83 that will serve as wordlines and a section of the polysilicon material 83 (without the photo-resist material 85) is removed in the center of the emerging NVM cell above the second dielectric layer 22. The polysilicon wordlines 83 are etched for planarization. P-type ions are implanted in the substrate 12 below the main surface 28 in the area not covered by polysilicon material 83 to form insulating P-type region 38 to prevent leakage current between the N-type channel.

Figure 8:
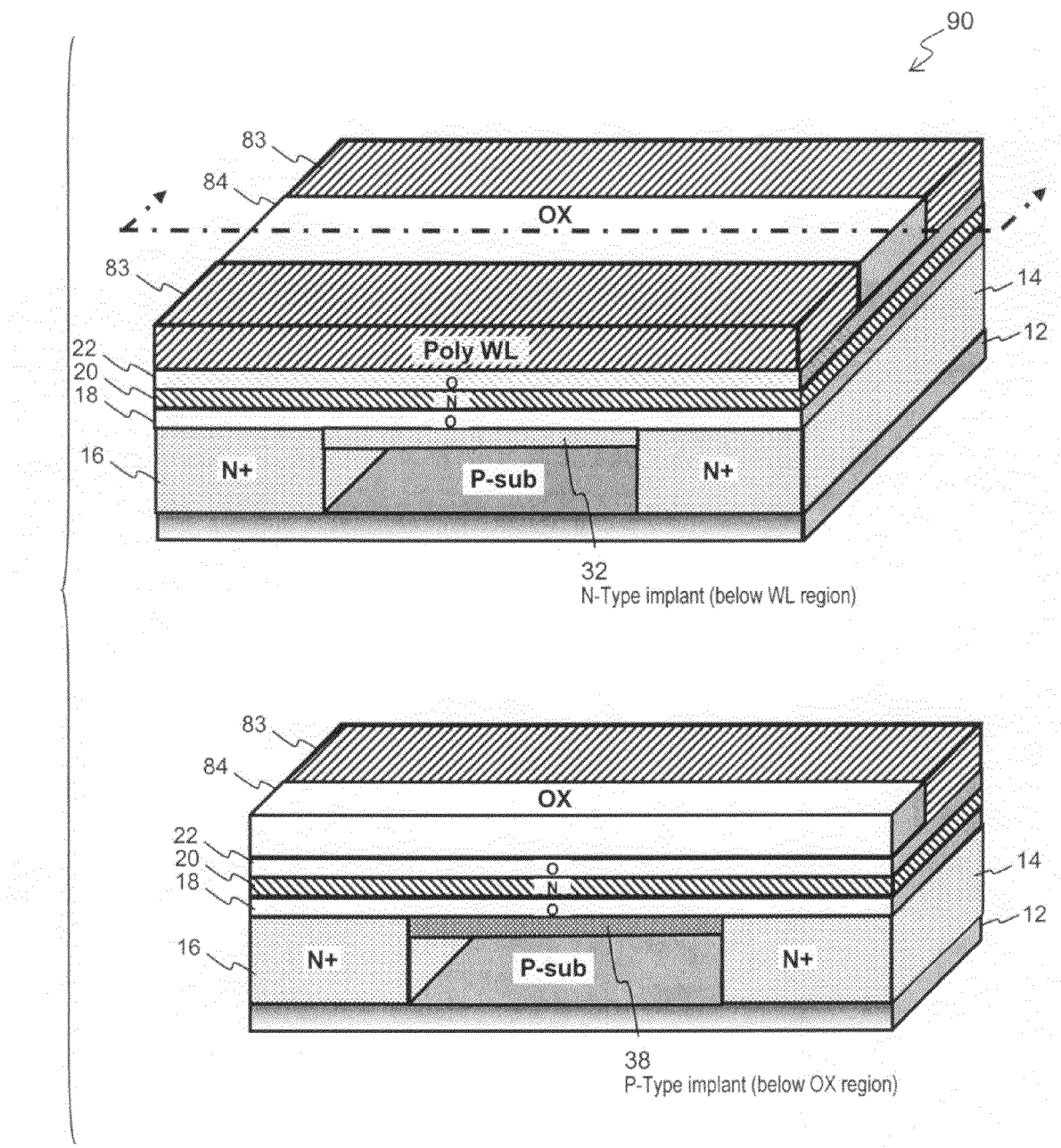
FIG. 8 is a schematic of an oxide insulator deposition process in a NVM cell in accordance with a preferred embodiment of the present invention.

In FIG. 8, an oxide material layer 84 is deposited between the polysilicon wordlines 83 and the oxide deposit is etched for planarization. NVM cell 90 is thereby complete. As the sectional line in FIG. 8 shows, NVM cell 90 is formed with N-type channel implantation 32 in the substrate 12 below the polysilicon wordline layers 83 between source/drain regions 14 and 16 to achieve the channel without application of bias voltage to the polysilicon wordline gate 83. FIG. 8 also shows P-type region 38 in the substrate 12 below the oxide insulator region 84 between source/drain regions 14 and 16.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A method of forming a non-volatile memory cell comprising:
   (i) providing a semiconductor substrate having a main surface;
   (ii) forming an ion implantation resistant layer on the main surface of the memory array region;
   (iii) implanting N-type ions to form a channel region below the main surface of the semiconductor substrate, wherein the channel region has a doping type different from a doping type of the semiconductor substrate;
   (iv) removing the ion implantation resistant layer applied in step (ii);
   (v) depositing a first at least one dielectric layer and at least one charge trapping layer above the main surface of the semiconductor substrate, the at least one charge trapping layer disposed above the first at least one dielectric layer;
   (vi) forming an ion implantation resistant layer on the surface of the charge trapping layer outside a first and second source/drain target region below the main surface of the semiconductor substrate;
   (vii) implanting N-type ions to form a first and second source/drain region below the main surface of the semiconductor substrate;
   (viii) removing the ion implantation resistant layer applied in step (vi);
   (ix) depositing at least two wordline material layers on the surface of charge trapping layer;
   (x) forming an ion implantation layer on the surface of the wordline material layer;
   (xi) etching the wordline material layer for planarization;
   (xii) implanting P-type ions to form an insulating region below the main surface of the semiconductor substrate outside the region of the main surface with the wordline material layer disposed above;
   (xiii) removing the ion implantation resistant layer applied in step (x);
   (xiv) depositing an insulating layer on the surface of the charge trapping layer between the wordline material layers; and
   (xv) etching the insulating layer for planarization.

2. The method of fowling a non-volatile memory cell according to claim 1, wherein the step (v) further comprises depositing a second at least one dielectric layer above the charge trapping layer.

3. The method of forming a non-volatile memory cell according to claim 2, wherein the second at least one dielectric layer is an oxide.

4. The method of forming a non-volatile memory cell according to claim 1, wherein the first at least one dielectric layer is an oxide.

5. The method of forming a non-volatile memory cell according to claim 1, wherein the at least one charge trapping layer is a silicon nitride.

6. The method of forming a non-volatile memory cell according to claim 1, wherein the wordline material layer is a polysilicon.

7. The method of forming a non-volatile memory cell according to claim 1, wherein the insulating layer is an oxide.

8. A memory array comprised of a plurality of non-volatile memory cells formed by the method of claim 1.

9. A memory array comprised of a plurality of non-volatile memory cells formed by the method of claim 2.

* * * * *